US006744659B1

United States Patent
Eby et al.

(10) Patent No.: US 6,744,659 B1
(45) Date of Patent: Jun. 1, 2004

(54) SOURCE-BIASED MEMORY CELL ARRAY

(75) Inventors: Michael D. Eby, Battle Ground, WA (US); Gregory P. Mikol, Vancouver, WA (US); James E. DeMaris, Ridgefield, WA (US)

(73) Assignee: Analog Devices, Inc., Norwood, MA (US)

( * ) Notice: Subject to any disclaimer, the term of this patent is extended or adjusted under 35 U.S.C. 154(b) by 15 days.

(21) Appl. No.: 10/315,523

(22) Filed: Dec. 9, 2002

(51) Int. Cl.[7] .................................................. G11C 7/00
(52) U.S. Cl. .................... 365/154; 365/189.09
(58) Field of Search .................. 365/154, 189.09, 365/205

(56) References Cited

U.S. PATENT DOCUMENTS

| 4,543,500 | A | * | 9/1985 | McAlexander et al. | 327/57 |
| 4,754,167 | A | | 6/1988 | Conkle et al. | 307/296 R |
| 4,982,365 | A | * | 1/1991 | Ohtani et al. | 365/189.11 |
| 5,159,571 | A | * | 10/1992 | Ito et al. | 365/201 |
| 6,088,277 | A | | 7/2000 | Kim et al. | 365/207 |

* cited by examiner

Primary Examiner—Vu A. Le
(74) Attorney, Agent, or Firm—Koppel, Jacobs, Patrick & Heybl

(57) ABSTRACT

A memory cell array employs "source-biasing", wherein a bias voltage is applied to the sources of one or more FETs within a memory cell to reduce their "off" state sub-threshold leakage currents. The source-bias voltage is selectively switched between a small positive bias voltage for "off" FETs, and ground for FETs which are being read. A plurality of source-bias circuits provides the selectively switched bias voltages to the memory cells in the array.

22 Claims, 5 Drawing Sheets

SOURCE-BIASED MEMORY CELL ARRAY

BACKGROUND OF THE INVENTION

1. Field of the Invention

This invention relates to the field of field-effect transistor (FET) memories, and particularly to techniques for reducing sub-threshold leakage currents in FETs making up an array of memory cells.

2. Description of the Related Art

Semiconductor computer memories typically comprise a number of memory cells arranged into a row and column array. The cells can be arranged to provide various types of memories, such as random access memory (RAM) and read-only memory (ROM).

A conventional ROM having an exemplary 4 row by 4 column array of memory cells is shown in FIG. 1. Each memory cell 10 comprises a single FET transistor. The gates of the FETs in a given row are connected to a respective ROW line, the drains of the FETs in a given column are connected to a respective BITLINE, and the sources of the FETs in the array are connected to ground. The FETs are programmed by some means so that each is either intact (programmed to a "0") or not (programmed to a "1"). To read the state of each memory cell, the BITLINEs are typically pre-charged to a particular supply voltage. A memory cell is then read by enabling its ROW line and sensing the voltage of its BITLINE. If the FET being read is intact, it conducts current from its drain to its source and pulls down the BITLINE voltage. If not intact, the BITLINE voltage is unaffected. The BITLINE voltage is sensed to determine the state of a memory cell.

In practice, there may be extended periods during which none of the memory cells are being read. Even when a ROM is being read, there are generally only a relatively small subset of memory cells which are read at any given time. Thus, most or all of the intact FETs in the array. are commonly in their "off" or "stand-by" states; i.e., with their ROW lines at ground and their BITLINEs at the supply voltage. Unfortunately, under these conditions, each intact FET which is "off" exhibits some sub-threshold leakage current; i.e., current which is conducted from drain to source when the FET's gate voltage is less that its threshold voltage. This leakage current is typically on the order of hundreds of nanoamps per FET, and for a large array, the total leakage current can add up to hundreds of milliamps or more.

The use of modern generation CMOS technologies can further exacerbate this problem. To produce faster switching speeds, FET channel lengths are becoming shorter, gate oxide layers are becoming thinner, and threshold voltages are becoming lower. Though these smaller geometry transistors provide faster switching speeds and higher "on" currents, the ability to turn these transistors off becomes very difficult, and excessive leakage currents can result.

One approach used to reduce leakage current is the application of a substrate back-bias voltage. The back-bias voltage is applied to the FET's substrate, which has the effect of increasing the FET's threshold voltage. This does reduce the FET's "off" current, but—because the back-bias voltage is always present—also reduces the FET's "on" current, which is undesirable. It is possible to switch the back-bias on only during stand-by mode, but the time required to switch the back-bias on and off may be prohibitively long since it requires driving the entire substrate of the IC, which is a high capacitive load.

SUMMARY OF THE INVENTION

A memory cell array is presented which overcomes the problems noted above, providing reduced "off" state leakage current while having little to no impact on a cell's "on" current or switching speed.

The present invention is a memory cell array which employs "source-biasing", wherein a bias voltage is applied to the source of one or more FETs contained within a memory cell to reduce its "off" state leakage current. The source-bias voltage is selectively switched between a small positive bias voltage for "off" FETs and ground for FETs which are "on".

A memory cell array in accordance with the present invention comprises a plurality of FETs arranged into a row and column array. Each column has a respective common node, to which the sources of all the FETs in the column are connected. A plurality of source-bias circuits is connected to respective common nodes. Each source-bias circuit comprises a resistance connected between the common node and ground, and a switch connected across the resistance which, when closed, provides a low-resistance conductive path between the common node and ground. The switch is closed in response to a "read select" signal which is enabled whenever one of the FETs connected to the source-bias circuit's common node is read. When the "read select" signal is disabled, the resistance conducts the sub-threshold drain-source leakage currents of the FETs connected to the source-bias circuit's common node, and thereby produces a voltage at the common node which positively biases the sources of the FETs and thereby reduces their sub-threshold drain-source leakage currents.

The invention is applicable to a number of different FET-based memory types, including ROMs and RAMs.

Further features and advantages of the invention will be apparent to those skilled in the art from the following detailed description, taken together with the accompanying drawings.

DETAILED DESCRIPTION OF THE INVENTION

Figure 2:
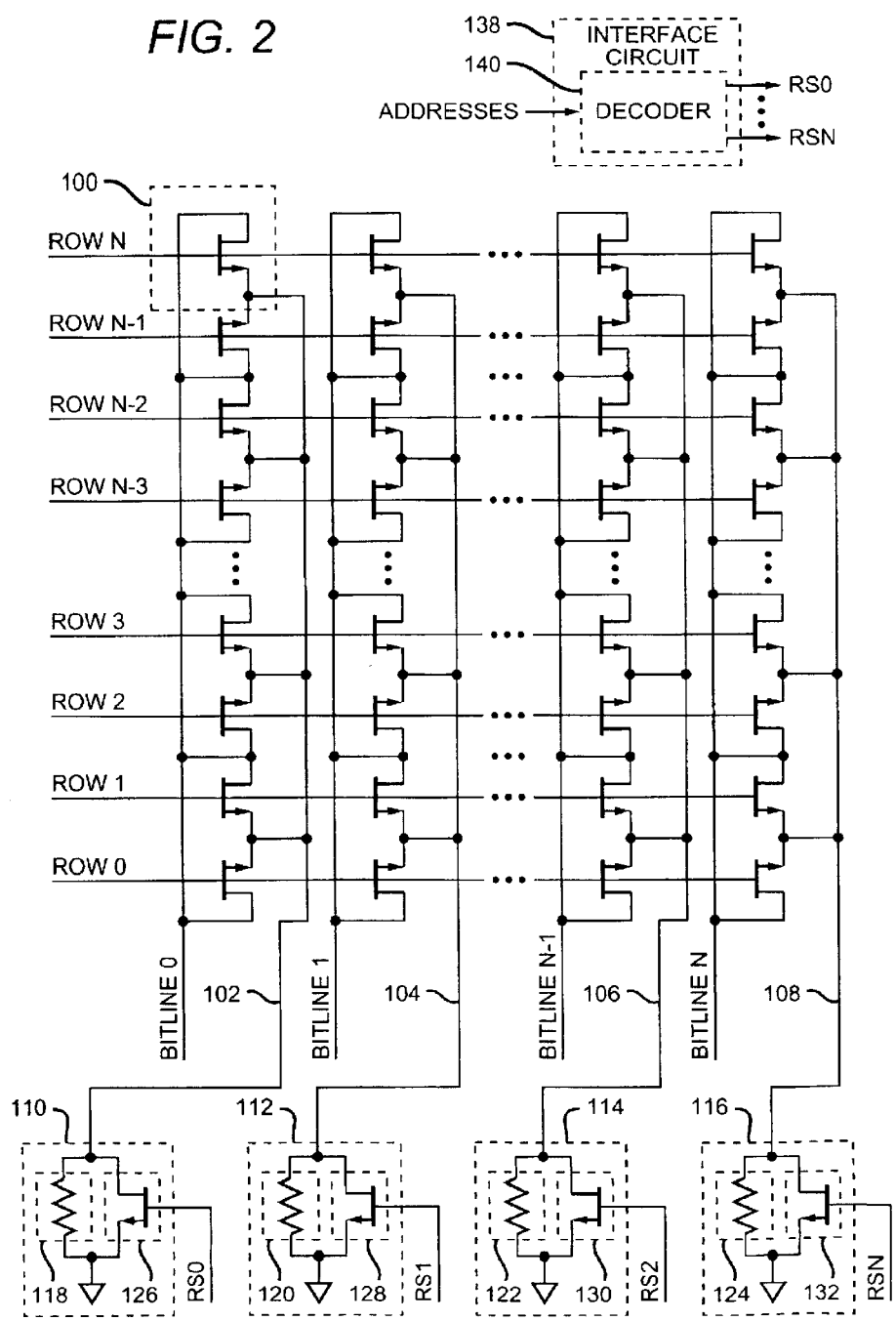
FIG. 2 is a schematic diagram of a source-biased memory cell array per the present invention.

A source-biased memory cell array in accordance with the present invention is shown in FIG. 2. The exemplary embodiment shown depicts a ROM array, though the invention is equally applicable to other FET-based memory types such as staticRAM (SRAM).

Each cell 100 in the ROM array contains a single FET, and the FETs are arranged into an array of N rows and M columns. As explained above, the gates of the FETs in a given row are connected to a respective ROW line, and the drains of the FETs in a given column are connected to a respective BITLINE. The FETs are programmed by some means so that each is either intact (programmed to a "0") or not (programmed to a "1"). To read the state of each memory cell, the BITLINEs are typically pre-charged to a particular supply voltage. A memory cell is then read by enabling its ROW line and sensing the voltage of its BITLINE. If the FET being read is intact, it conducts current from its drain to its source and pulls down the BITLINE voltage, indicating a "0". If not intact, the BITLINE voltage is unaffected (indicating a "1"). The BITLINE voltage is sensed to determine the state of a memory cell.

Previously, the sources of each FET in the ROM were connected to ground. Here, however, each column in the array has a respective common node (102,104,106,108), and the sources of the FETs in each column are connected to the column's common node. A plurality of source-bias circuits (110,112,114,116) is connected to respective common nodes. Each source-bias circuit comprises a resistance (118, 120,122,124) connected between the source-bias circuit's common node and ground, and a switch (126,128,130,132) connected across the resistance which, when closed, provides a low-resistance conductive path between the source-bias circuit's common node and ground.

Each switch (126,128,130,132) is closed in response to a "read select" signal (RS0,RS1,RS2,RSN), which is enabled whenever one of the FETs connected to a source-bias circuit's common node is read. When none of the FETs connected to a source-bias circuit's common node is being read, the source-biased circuit's "read select" signal is disabled, such that the source-biased circuit's resistance (118,120,122,124) is connected between the common node and ground.

As noted above, the array's BITLINEs are normally charged up to a supply voltage. It was also noted above that when not being read, a FET's ROW line is not enabled and that such a non-enabled FET, if intact, conducts a sub-threshold drain-source leakage current from its drain to its source. When all of the FETs in the array are considered, the cumulative sum of these leakage currents can amount to a substantial current.

The invention reduces the magnitude of these sub-threshold drain-source leakage currents. When none of the FETs connected to a source-bias circuit's common node is being read, its "read select" signal is disabled and its switch is open, such that the source-biased circuit's resistance (118,120,122,124) conducts the sub-threshold drain-source leakage currents of the FETs connected to the common node. This causes a voltage to develop across the resistance—and thus at the common node—which positively biases the FETS' source terminals and thereby reduces their sub-threshold drain-source leakage currents.

For example, memory cell 100 is located within column '0', and the sources of the FETs in column '0' are connected to common node 102. Source-bias circuit 110, which includes resistance 118 and a switch 126 controlled by "read select" signal RS0, is connected between common mode 102 and ground. When none of the cells in column '0' is being read, RS0 is disabled and switch 106 is open. The sub-threshold leakage currents of each FET in column '0' flow through resistance 118, developing a voltage which biases the source terminals of each of the FETs connected to common node 102. This source-bias voltage reduces the magnitude of the FETs' sub-threshold leakage currents. However, if one or more of the memory cells in column '0' is being read, RS0 is enabled and switch 106 is closed. This essentially connects the source terminals of the FETs in column '0' to ground, such that the invention has no adverse impact on their "on" currents or their switching speeds.

Switches 126, 128, 130 and 132 are preferably FETs having their drain-source circuits connected between common nodes 102, 104, 106 and 108, respectively, and ground. Their gates are connected to respective "read select" signals, such that each FET switch is turned on whenever its "read select" signal is enabled. When turned on, the FET switch provides a low-resistance conductive path between the source-bias circuit's common node and ground.

Resistances 118, 120, 122, 124 may take any of a number of forms. As shown in FIG. 2, the source-bias circuits' resistances can be implemented with respective resistors. Since the resistances are only in-circuit when none of the FETs connected to a source-bias circuit's common node is being read, their resistance values should be as large as practically possible—to provide the highest possible source-bias voltages and thus the lowest possible sub-threshold leakage currents.

Figure 3:
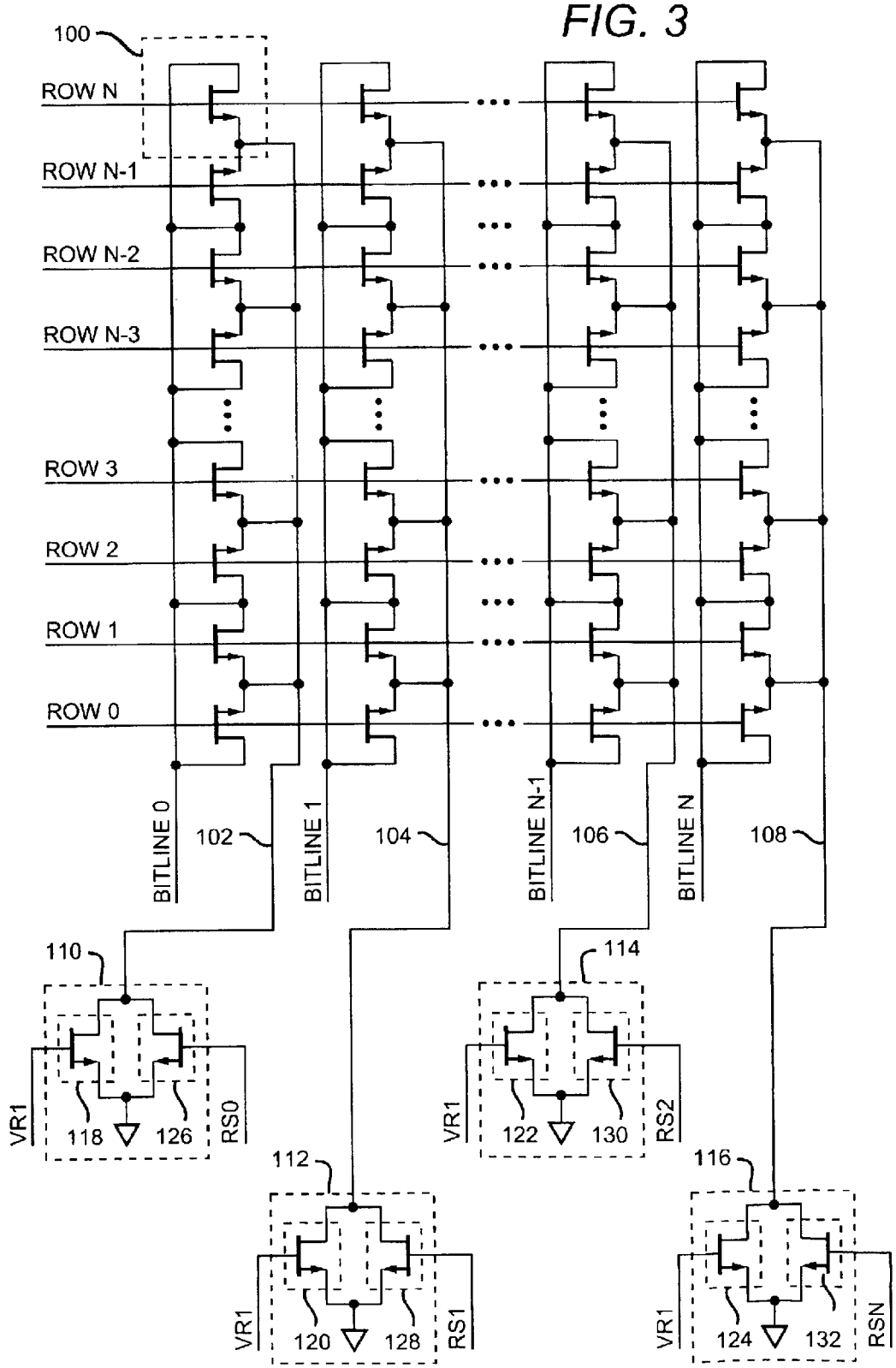
FIG. 3 is a schematic diagram of another embodiment of a source-biased memory cell array per the present invention.

Another possible implementation of resistances 118, 120, 122, 124 is shown in FIG. 3. Here, the resistances are provided by FETs which are biased with a bias voltage VR1 to operate in their linear regions. This provides small source-bias voltages which are sufficient to reduce the sub-threshold leakage currents of the 'off' FETs connected to each source-bias circuit's common node. This approach—i.e., using a FET to provide the source-bias circuit's resistance—is very practical and easy to implement. However, the resistance so provided will vary somewhat with the voltage across the biased FET, and thus the magnitude of the leakage current reduction can vary due to the variable number of intact memory cell FETs that can exist in any given column of the ROM.

Figure 4:
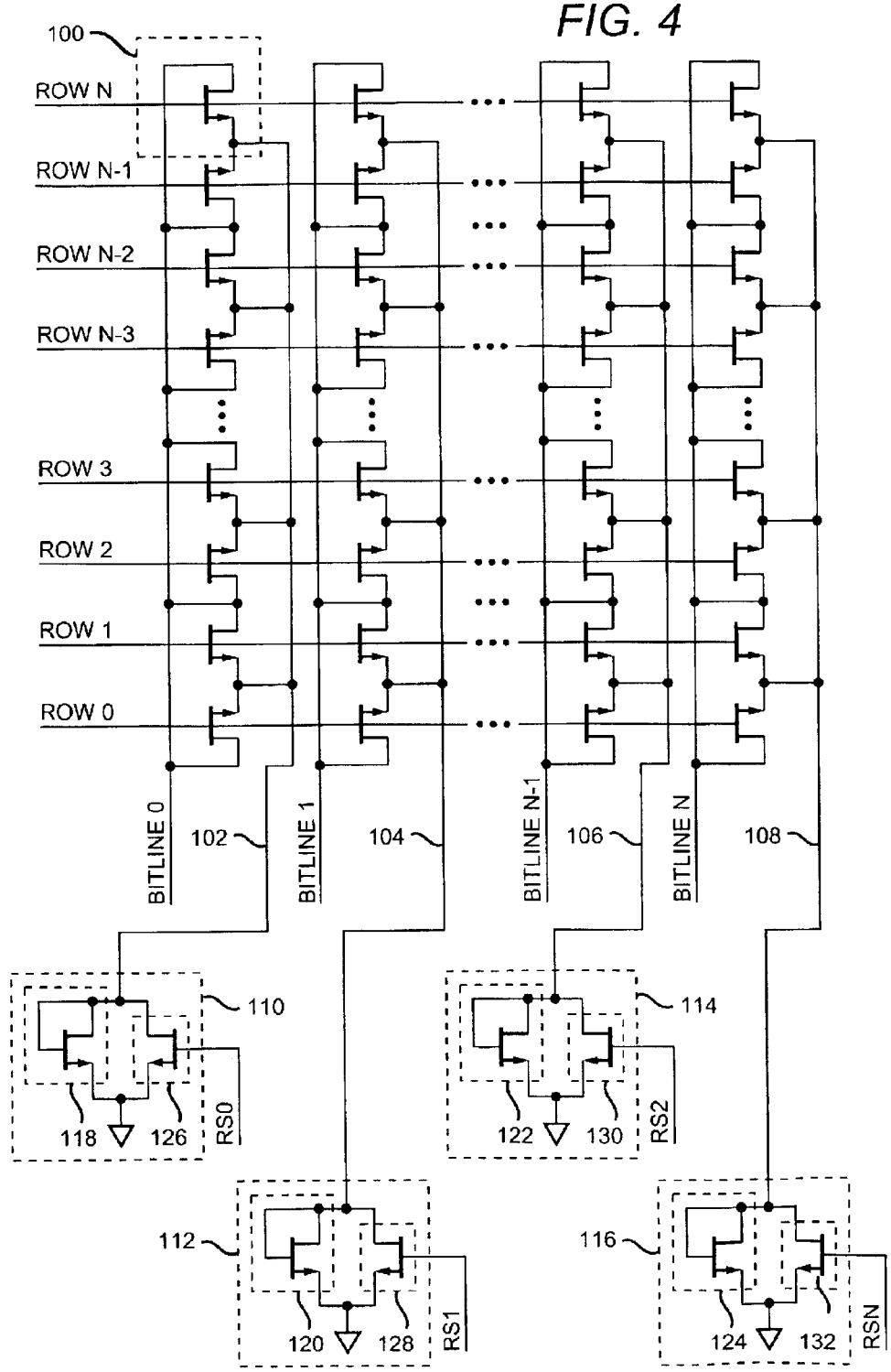
FIG. 4 is a schematic diagram of another embodiment of a source-biased memory cell array per the present invention.

Yet another possible implementation of resistances 118, 120, 122, 124 is shown in FIG. 4. Here, the resistances are provided with diode-connected FETs which operate in their saturation regions, thereby providing source-bias voltages which are about equal to each FET's threshold voltage. The source-bias voltages remain relatively constant regardless of the number of memory cell FETs connected to any given column. These relatively constant source-bias voltages provide a predictable. reduction in leakage current per memory cell FET; i.e., the leakage of a given FET will be the same for a column having only one intact FET and a column having tens or hundred of intact FETs.

The generation of the "read select" signals (RS0,RS1, RS2,RSN) can be approached in several different ways. The simplest arrangement is to have the "read select" lines globally connected, such that all "read select" lines are enabled when any row is selected as part of a read operation. When so arranged, the invention provides no reduction of sub-threshold leakage currents during read operations, since all sources will be connected to ground through their respective source-bias circuits. However, when no read operations are occurring, no "read select" lines are enabled, the source-bias circuits apply source-bias voltages to their respective common nodes, and the array's sub-threshold leakage currents are thereby reduced. In many applications, the memory array is not being read—i.e., is in "stand-by" mode—for extended periods. Thus, the invention serves to reduce sub-threshold leakage currents when current consumption is ideally at a minimum—i.e., during stand-by.

Another approach to the. generation of the "read select" signals (RS0,RS1,RS2,RS3) is to enable only those which are connected to BITLINES that are actively being read. In practice, the cells in a memory array are assigned unique addresses, and a cell or group of cells is read by specifying the appropriate addresses to an interface circuit 138 which enables the appropriate ROW line, senses the appropriate BITLINES, and returns the desired memory contents. The addresses to be read are decoded, by, for example, a decoder 140 (shown in FIG. 2), to determine the 1-of-n selection of a single bitline or group of bitlines and the row for the address or addresses being read. The same signal which indicates which of the bitlines are to be read can also be used to enable the appropriate read select lines.

As an example, assume a memory cell array of 256×256 cells. If the "read select" lines are globally connected, all "read select" lines are enabled when a read occurs. In this case, none of the FETs in the array will be source-biased, and thus the FETs in the non-selected rows will contribute their maximum sub-threshold leakage currents. During a read, the 256 FETS in the selected row conduct "on" currents, while (256*256)−256=65,280 FETs will exhibit their maximum sub-threshold leakage currents.

If, however, the memory addresses are decoded such that only the "read select" lines associated with the selected bitlines to be read are enabled, then all FETs in non-read bitlines in non-selected rows will be source-biased. Assume, for example, that the memory addresses are decoded such that during a read, only 16 bitlines are actively read at any one time. In this case, there are 16 FETs which have their sources connected to ground (from the 16 selected bitlines) through the switch sides of their respective source-bias circuits such that they see their full "on" currents. The remaining FETs in a selected row, 256−16=240 FETs, will see pseudo-full "on" currents i.e., with their ROW line high but with sources which are biased. Then, 255*16=4080 FETs exhibit maximum non-source-biased "off" currents, and the remaining FETs ((256−16)*255=61,200 FETs) have minimum, source-biased "off" currents.

Figure 5:
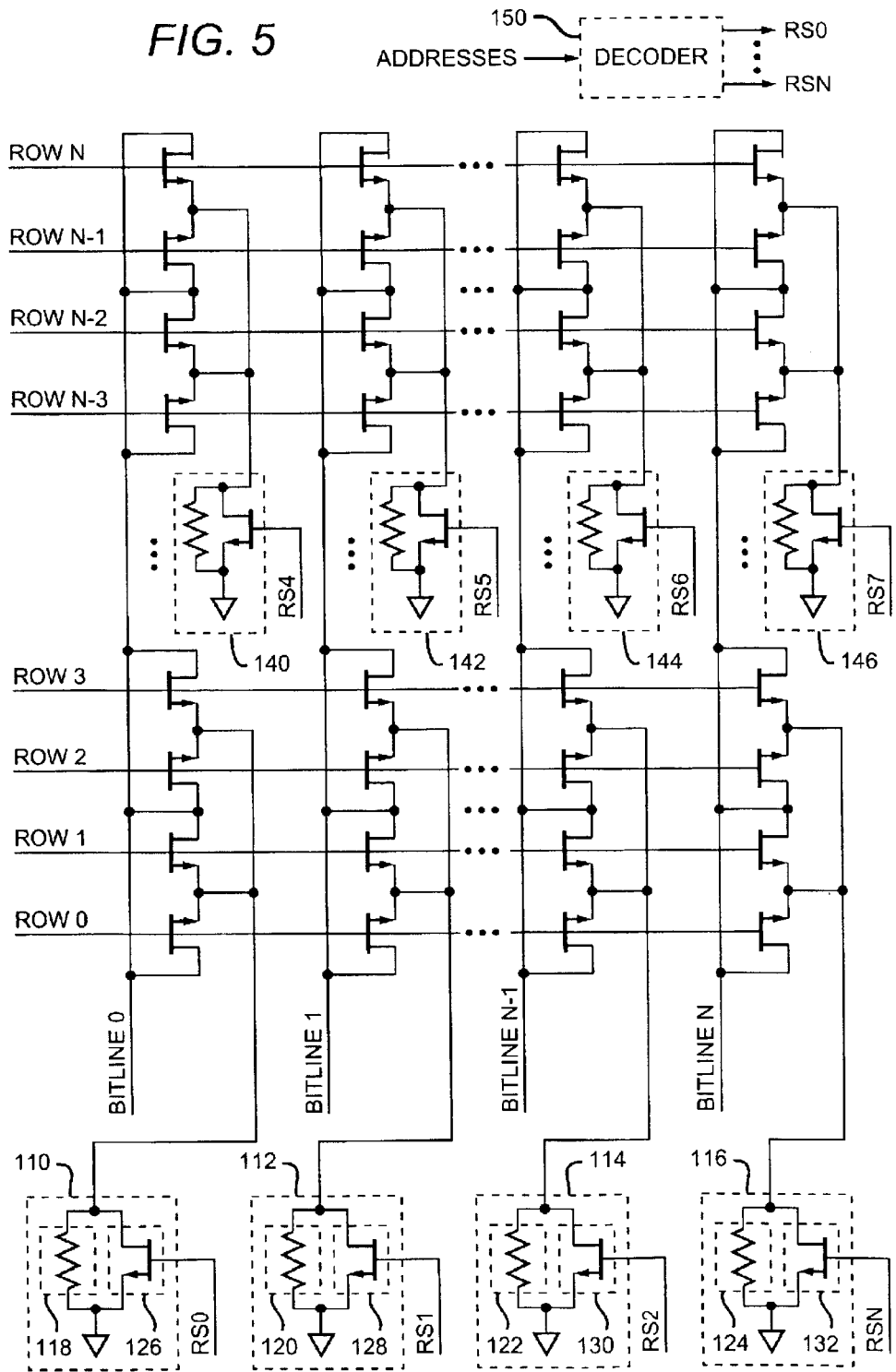
FIG. 5 is a schematic diagram of another embodiment of a source-biased memory cell array per the present invention.

For the embodiments shown in FIGS. 2–4, when any cell in a column is accessed or read, the FETs that remain "off" (ROW line not selected) in the selected column have their sources connected to ground or near ground, because the column's "read select" line is enabled. These FETs will therefore exhibit sub-threshold leakage currents as described above. One way to reduce this effect is shown in the memory cell array embodiment shown in FIG. 5. Here, the columns are partitioned into sections, each of which has its own source-bias circuit. For example, in FIG. 5, each column is divided into "subcolumns" of 4 FETs each, with each subcolumn having its own source-bias circuit. Thus, the subcolumns in the lower part of the array are connected to source-bias circuits 110, 112, 114 and 116, while the subcolumns in the upper part of the array are connected to source-bias circuits 140, 142, 144 and 146—each of which receives a respective "read select" signal (RS4, RS5, RS6 and RS7).

When the columns are partitioned into subcolumns, the "read select" lines can be operated in any of the ways described above. For example, a source-bias circuit's "read select" line can be enabled when any row in the subcolumn is selected as part of a read operation. Assume, for example, that a memory cell array includes 512 FETs in each column. When a given row is selected as part of a read operation, there could be as many as 511 FETs that generate sub-threshold leakage currents—if the array is not partitioned as described herein. However, if each column is partitioned into, for example, four sub-columns of 128 FETs each, when a row is selected there will be 127 FETs exhibiting maximum sub-threshold leakage currents, with the other 384 FETs in the column source-biased to reduce the total sub-threshold leakage current.

A partitioned array could also be arranged to enabled only those "read select" signals which are connected to bitlines that are actively being read, in the manner described above. The addresses to be read could be decoded, by, for example, a decoder 150, to determine the 1-of-n selection of a single bitline or group of bitlines and the row for the address or addresses being read. The same signal which indicates which of the bitlines are to be read can also be used to enable the appropriate "read select" lines. Assume, for example, a 256×256 memory cell array as described above, which is partitioned into 4 groups of 64 rows, and for which only 16 bitlines are actively read at any one time. In this case, during a read there are 16 FETs which have their sources connected to ground (from the 16 selected bitlines) such that they see their full "on" currents. The remaining FETs in a selected row, 256−16=240 FETs, will see pseudo-full "on" currents—i.e., with their ROW line high but with sources which are biased. Then, 63*16=1008 FETs exhibit maximum non-source-biased "off" currents, and the remaining FETs ((256−16)*255+(16*(256−64))=64,272 FETS) have minimum, source-biased "off" currents.

The column partitioning described above provides another advantage unrelated to leakage current. When there is no column partitioning, the switched source lines run the entire length of the array. These switched source lines present a considerable load, which can slow the speed with which the lines can be switched from their source-biased levels to a ground level when a read occurs. Reducing the length of the source lines by partitioning the columns as described herein improves the speed with which the array can be operated.

The invention is employed as part of a ROM in FIGS. 2–5; note, however, that the invention is not limited to use with mask-programmed ROMs. Any array of FET-based memory cells which exhibits an unacceptable amount of sub-threshold leakage current might benefit from the invention, including EPROM, EEPROM, PROM, flash memory, etc. The invention can also be useful when used with a random-access memory (RAM).

Figure 1:
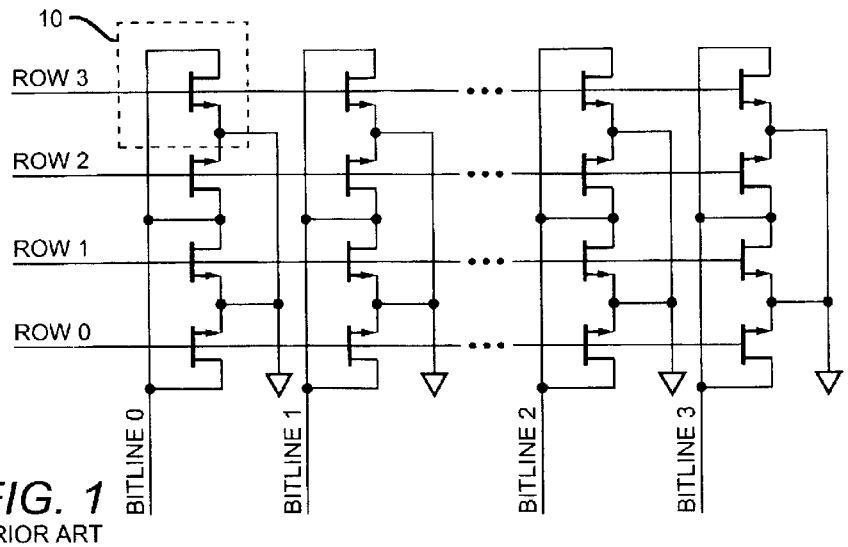
FIG. 1 is a schematic diagram of a known memory cell array.
Figure 6:
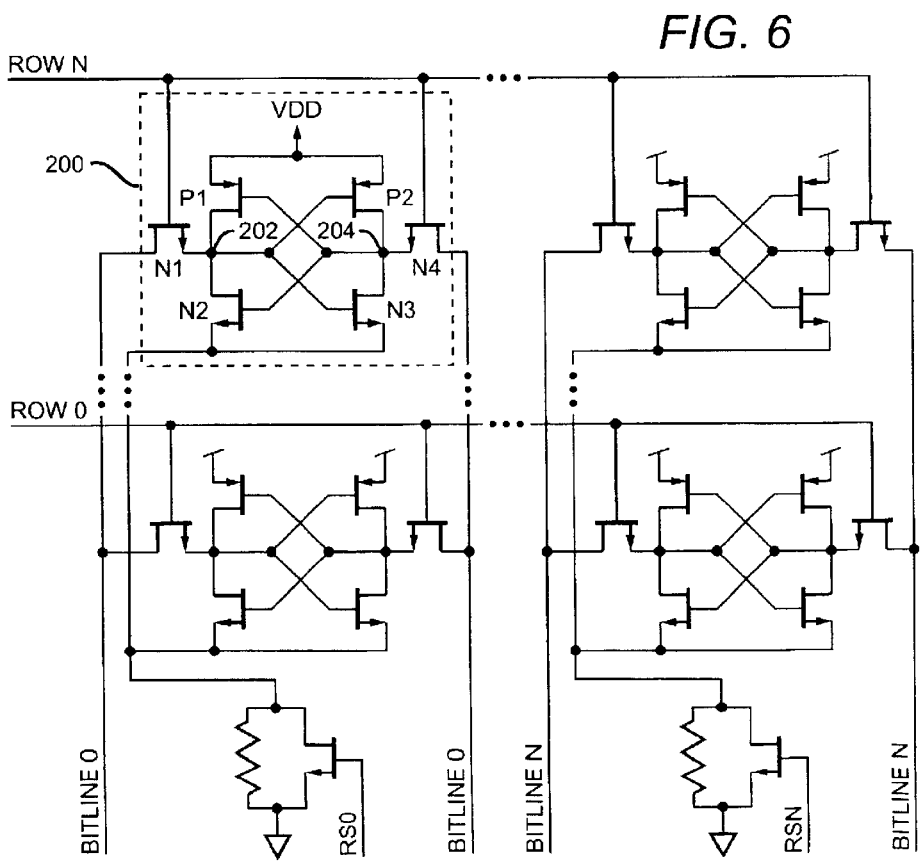
FIG. 6 is a schematic diagram of one possible embodiment of a source-biased RAM array per the present invention.

An example of the invention as it might be used with a RAM is shown in FIG. 6. Here, the RAM is a static-RAM (SRAM), comprising an array of 6 transistor (6T) SRAM cells. Each cell, such as cell 200, includes a pair of PMOS pull-up FETs P1 and P2 and a pair of NMOS pull-down FETs N2 and N3 arranged in a latch configuration, and a pair of NMOS pass FETs N1 and N4. As before, the cells are arranged into a row and column array, with the cells of each row connected to a respective ROW line, and the cells of each column connected to complementary BITLINEs (e.g., BITLINE 0 and its complement, BITLINEB 0). When, for example, cell 200 is holding data corresponding to a logic "1", the voltage at the junction 202 of FETs P1 and N2 is at VDD, and the voltage at the junction 204 of FETs P2 and N3 is at zero.

Typically, the complementary bitlines are precharged to a nominal supply voltage. When so arranged, there are three different leakage paths associated with the SRAM cell. There is a leakage path through one of the pull-up FETs (either P1 or P2), a path through one of the pull-down FETs (either N2 or N3), and a path through one of the pass FETs (either N1 or N4). In the case illustrated, with the voltages at nodes 202 and 204 as described above and the ROW line not selected, there are sub-threshold leakage currents flowing through "off" FETs P2, N2, and N4. If a small positive source bias is applied to the sources of FETs of N2 and N3, the sub-threshold leakage currents from these FETs will be significantly reduced. A source-bias voltage has little effect on P2's leakage current, but this is the smallest leakage component of the three. In this example, N2 will see the source-bias voltage directly at its source, and N4 will see the source-bias voltage at its source via "on" FET N3.

For a RAM, there will always be a fixed number of RAM cells connected to the source bias circuits. In contrast, for a ROM, the number of FETs programmed to '0' will vary, and hence the total leakage current for a given column will vary. The RAM leakage current does not have this variability. Since this is the case, a source-bias circuit in which the resistance is a biased FET (as shown in FIG. 3) is preferred over one in which the resistance is a diode-connected FET (as shown in FIG. 4); the FIG. 3 approach provides more control over the bias voltage, whereas the FIG. 4 scheme constrains the bias to at least a threshold voltage.

Note that the SRAM circuitry shown in FIG. 6 is merely exemplary. The invention is useful with any FET-based RAM cell which exhibits sub-threshold leakage currents when not being read.

While particular embodiments of the invention have been shown and described, numerous variations and alternate embodiments will occur to those skilled in the art. Accordingly, it is intended that-the invention be limited only in terms of the appended claims.

We claim:

1. A source-biased memory cell array, comprising:
   a plurality of memory cells arranged into a row and column array, each of said columns having a respective common node, each of said cells comprising at least one field-effect transistor (FET), the sources of at least one FET from each cell in a given column connected together at said column's common node, the gates of at least one FET from each cell connected to a respective row address line which is enabled when the state of said memory cell is read, at least one of the FETs in at least some of said cells conducting a sub-threshold leakage current to said common node when said cell is not being read, and
   a plurality of source-bias circuits, each of which is connected to a respective one of said common nodes, each of said source-bias circuits comprising:
      a resistance connected between said source-bias circuit's common node and ground, and
      a switch connected across said resistance which, when closed, provides a low-resistance conductive path between said source-bias circuit's common node and ground, said switch closed in response to a "read select" signal which is enabled whenever one of the memory cells connected to said source-bias circuit's common node is read,
      said memory cell array arranged such that, when said "read select" signal is disabled, said resistance conducts the sub-threshold drain-source leakage currents of the FETs connected to said source-bias circuit's common node and thereby produces a voltage at said common node which reduces said sub-threshold drain-source leakage currents.

2. The memory cell array of claim 1, wherein said resistance is a resistor.

3. The memory cell array of claim 1, wherein said resistance is a FET biased to operate in its linear region.

4. The memory cell array of claim 1, wherein said resistance is a diode-connected FET.

5. The memory cell array of claim 1, wherein said switch is a FET having its drain-source circuit connected across said resistance and its gate connected to said "read select" signal such that it is turned on and thereby provides said low-resistance conductive path when said "read select" signal is enabled.

6. The memory cell array of claim 1, further comprising an interface circuit which provides said "read select" signals to said source-bias circuits.

7. The memory cell array of claim 6, wherein said interface circuit is arranged to enable all of the "read select" signals provided to said source-bias circuits when any memory cell is being read.

8. The memory cell array of claim 6, wherein said interface circuit is arranged to enable only the "read select" signals provided to source-bias circuits which are connected to columns containing memory cells which are being actively read.

9. The memory cell array of claim 8, wherein each memory cell has a respective address, said interface circuit further comprising an input which receives addresses to be read and a decoder which decodes said addresses and thereby identifies which of said columns said addressed cells are in, said controller further arranged to enable only the "read select" signals provided to source-bias circuits which are connected to columns identified by said decoder.

10. The memory cell array of claim 1, wherein each column of said memory cell array is divided into a plurality of subcolumns, each of said subcolumns having a respective one of said common nodes, the sources of at least one FET from each cell in a given subcolumn connected together at said subcolumn's common node, each of said common nodes connected to a respective one of said source-bias circuits.

11. The memory cell array of claim 10, further comprising an interface circuit which provides said "read select" signals to said source-bias circuits, said controller arranged to enable only the "read select" signals provided to source-bias circuits connected to subcolumns containing memory cells in rows which are being read.

12. The memory cell array of claim 1, wherein said array of memory cells forms a read-only memory (ROM).

13. The memory cell array of claim 12, wherein each memory cell comprises one FET, the gates of the FETs in said cells connected to respective row lines, the FETs in said cells forming columns of FETs, the drains of which are connected to respective bitlines, the state of each FET read by enabling its row line and detecting the voltage on its bitline.

14. The memory cell array of claim 1, wherein said array of memory cells forms a random-access memory (RAM).

15. The memory cell array of claim 14, wherein each of said memory cells comprises a plurality of FETs arranged in a latch configuration and connected between a supply voltage and one of said common nodes.

16. The memory cell array of claim 14, wherein said RAM is static-RAM (SRAM).

17. A source-biased memory cell array, comprising:
    a plurality of memory cells arranged into a row and column array, each column of said memory cell array divided into a plurality of subcolumns, each of said subcolumns having a respective common node, each of said cells comprising at least one field-effect transistor (FET), the sources of at least one PET from each cell in a given subcolumn connected together at said subcolumn's common node, the gates of at least one FET from each cell connected to a respective row address line which is enabled when the state of said memory cell is read, and a plurality of source-bias circuits, each of which is connected to a respective one of said common nodes, each of said source-bias circuits comprising:
   a resistance connected between said source-bias circuit's common node and ground, and
   a switch connected across said resistance which, when closed, provides a low-resistance conductive path between said source-bias circuit's common node and ground, said switch closed in response to a "read select" signal which is enabled whenever one of the memory cells connected to said source-bias circuit's common node is read,
   such that, when said "read select" signal is disabled said resistance conducts the sub-threshold drain-source leakage currents of the FETs connected to said source-bias circuit's common node and thereby produces a voltage at said common node which positively biases the sources of said FETs and thereby reduces their sub-threshold drain-source leakage currents.

18. The memory cell array of claim 17, further comprising an interface circuit which provides said "read select" signals to said source-bias circuits, said controller arranged to enable only the "read select" signals provided to source-bias circuits connected to subcolumns containing memory cells in rows which are being read.

19. A source-biased read-only memory (ROM), comprising:
   a plurality of field-effect transistors (FETS) arranged into a row and column array to form an array of memory cells, each of said columns having a respective common node, the sources of the FETs in each column connected together at said column's common node, the gates of each FET connected to a respective row address line which is enabled when the state of said FET is read, and
   a plurality of source-bias circuits, each of which is connected to a respective one of said common nodes, each of said source-bias circuits comprising:
      a resistance connected between said source-bias circuit's common node and ground, and
      a switch connected across said resistance which, when closed, provides a low-resistance conductive path between said source-bias circuit's common node and ground, said switch closed in response to a "read select" signal which is enabled whenever one of the FETs connected to said source-bias circuit's common node is read,
      such that, when said "read select" signal is disabled said resistance conducts the sub-threshold drain-source leakage currents of the FETs connected to said source-bias circuit's common node and thereby produces a voltage at said common node which positively biases the sources of said FETs and thereby reduces their sub-threshold drain-source leakage currents.

20. The ROM of claim 19, wherein said ROM is a mask-programmed ROM.

21. A source-biased random-access memory (RAM), comprising:
   a plurality of RAM cells arranged into a row and column array, each of said columns having a respective common node, each of said RAM cells comprising at least one field-effect transistor (FET), the sources of at least one FET from each cell in a given column connected together at said column's common node, the gates of at least one FET from each cell connected to a respective row address line which is enabled when the state of said memory cell is read, at least one of the FETs in each cell conducting a sub-threshold leakage current to said common node when said cell is not being read, and
   a plurality of source-bias circuits, each of which is connected to a respective one of said common nodes, each of said source-bias circuits comprising:
      a resistance connected between said source-bias circuit's common node and ground, and
      a switch connected across said resistance which, when closed, provides a low-resistance conductive path between said source-bias circuit's common node and ground, said switch closed in response to a "read select" signal which is enabled whenever one of the RAM cells connected to said source-bias circuit's common node is read,
      said RAM arranged such that, when said "read select" signal is disabled said resistance conducts the sub-threshold drain-source leakage currents conducted to said source-bias circuit's common node and thereby produces a voltage at said common node which reduces said sub-threshold drain-source leakage currents.

22. The RAM of claim 21, wherein said RAM is a static-RAM (SRAM).

* * * * *